United States Patent
Park et al.

(10) Patent No.: US 9,293,389 B2
(45) Date of Patent: Mar. 22, 2016

(54) METHOD OF MANUFACTURING A SEMICONDUCTOR PACKAGE INCLUDING A SURFACE PROFILE MODIFIER

(71) Applicant: SAMSUNG ELECTRONICS CO., LTD., Suwon-si, Gyeonggi-do (KR)

(72) Inventors: Kyol Park, Daejeon (KR); Yun-Hyeok Im, Hwaseong-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/577,490

(22) Filed: Dec. 19, 2014

(65) Prior Publication Data

US 2015/0104905 A1  Apr. 16, 2015

Related U.S. Application Data

(62) Division of application No. 14/088,482, filed on Nov. 25, 2013, now Pat. No. 8,921,990.

(30) Foreign Application Priority Data

Dec. 18, 2012 (KR) .......................... 10-2012-0148218

(51) Int. Cl.
*H01L 23/22* (2006.01)
*H01L 23/367* (2006.01)
(Continued)

(52) U.S. Cl.
CPC .......... *H01L 23/3675* (2013.01); *H01L 21/561* (2013.01); *H01L 23/367* (2013.01); *H01L 23/3677* (2013.01); *H01L 24/83* (2013.01); *H01L 24/97* (2013.01); *H01L 25/0655* (2013.01); *H01L 25/0657* (2013.01); *H01L 25/105* (2013.01); *H05K 3/30* (2013.01); *H01L 2224/16225* (2013.01); *H01L 2224/32225* (2013.01); *H01L 2224/32245* (2013.01);
(Continued)

(58) Field of Classification Search
CPC .................... H01L 21/568; H01L 23/49517
USPC ........................................................ 257/687
See application file for complete search history.

(56) References Cited

U.S. PATENT DOCUMENTS

| 5,422,788 A | 6/1995 | Heinen et al. |
| 5,592,735 A | 1/1997 | Ozawa et al. |

(Continued)

FOREIGN PATENT DOCUMENTS

| JP | 2004-134480 A | 4/2004 |
| KR | 10-2001-0068505 A | 7/2001 |

(Continued)

*Primary Examiner* — Allen Parker
*Assistant Examiner* — Patricia Reddington
(74) *Attorney, Agent, or Firm* — Lee & Morse, P.C.

(57) ABSTRACT

A semiconductor package includes a circuit board having an inner circuit pattern and a plurality of contact pads connected to the inner circuit pattern, at least one integrated circuit (IC) device on the circuit board and making contact with the contact pads, a mold on the circuit board, the mold fixing the IC device to the circuit board, and a surface profile modifier on a surface of the IC device and a surface of the mold, and the surface profile modifier enlarging a surface area of the IC device and the mold to dissipate heat.

3 Claims, 7 Drawing Sheets

(51) Int. Cl.
  *H01L 25/065* (2006.01)
  *H01L 25/10* (2006.01)
  *H01L 21/56* (2006.01)
  *H01L 23/00* (2006.01)
  *H05K 3/30* (2006.01)
  *H05K 1/02* (2006.01)
  *H05K 3/28* (2006.01)

(52) U.S. Cl.
  CPC .......... *H01L 2224/48091* (2013.01); *H01L 2224/73204* (2013.01); *H01L 2224/8385* (2013.01); *H01L 2225/06513* (2013.01); *H01L 2225/06517* (2013.01); *H01L 2225/06541* (2013.01); *H01L 2225/06589* (2013.01); *H01L 2225/1023* (2013.01); *H01L 2225/1058* (2013.01); *H01L 2225/1094* (2013.01); *H01L 2924/10158* (2013.01); *H01L 2924/14* (2013.01); *H01L 2924/15311* (2013.01); *H01L 2924/181* (2013.01); *H05K 1/0209* (2013.01); *H05K 3/284* (2013.01); *H05K 2201/0215* (2013.01)

(56) References Cited

U.S. PATENT DOCUMENTS

| | | | |
|---|---|---|---|
| 6,206,997 | B1 | 3/2001 | Egitto et al. |
| 6,225,695 | B1 | 5/2001 | Chia et al. |
| 6,607,942 | B1 | 8/2003 | Tsao et al. |
| 6,953,710 | B2 | 10/2005 | Kang |
| 2005/0070046 | A1* | 3/2005 | Saito ............... 438/106 |
| 2005/0146004 | A1* | 7/2005 | Seto ............... 257/678 |
| 2009/0079020 | A1* | 3/2009 | Tanida et al. ........ 257/432 |
| 2009/0263939 | A1 | 10/2009 | Sakamoto et al. |
| 2011/0068481 | A1 | 3/2011 | Park et al. |
| 2012/0049334 | A1* | 3/2012 | Pagaila et al. ........ 257/666 |
| 2012/0171814 | A1* | 7/2012 | Choi et al. .......... 438/107 |
| 2013/0087904 | A1* | 4/2013 | Clark et al. .......... 257/706 |

FOREIGN PATENT DOCUMENTS

| | | |
|---|---|---|
| KR | 10-2005-0059619 A | 6/2005 |
| KR | 10-2010-0069007 A | 6/2010 |

* cited by examiner

METHOD OF MANUFACTURING A SEMICONDUCTOR PACKAGE INCLUDING A SURFACE PROFILE MODIFIER

CROSS-REFERENCE TO RELATED APPLICATIONS

This is a divisional application based on pending application Ser. No. 14/088,482, filed Nov. 25, 2013, the entire contents of which is hereby incorporated by reference.

Korean Patent Application No. 10-2012-0148218, filed on Dec. 18, 2012, in the Korean Intellectual Property Office, and entitled: "Semiconductor Package and Method of Manufacturing the Same," is incorporated by reference herein in its entirety.

BACKGROUND

1. Field

Example embodiments relate to a semiconductor package and a method of manufacturing the same.

2. Description of the Related Art

As recent electronic devices have been highly integrated with high performance, the semiconductor package is also manufactured to have small size and high density.

SUMMARY

Embodiments are directed to a semiconductor package including a circuit board having an inner circuit pattern and a plurality of contact pads connected to the inner circuit pattern, at least one integrated circuit (IC) device on the circuit board and making contact with the contact pads, a mold on the circuit board, the mold fixing the IC device to the circuit board, and a surface profile modifier on a surface of the IC device and a surface of the mold, the surface profile modifier enlarging a surface area of the IC device and the mold to dissipate heat.

The surface of the IC device may be coplanar with the surface of the mold.

The surface profile modifier may include a plurality of thermally conductive particles distributed on the surface of the IC device and the surface of the mold.

The thermally conductive particles may include a material selected from the group of copper, gold, aluminum, silicon, diamond, and combinations thereof.

The thermally conductive particles may have a diameter of about 1 μm to about 100 μm.

The surface profile modifier may include a heat transfer pattern on the surface of the IC device and the surface of the mold. Portions of the surface of the IC device and the surface of the mold may be exposed through the heat transfer pattern.

The portions of the surface of the IC device and surface of the mold that are exposed through the heat transfer pattern may include a plurality of recesses.

The semiconductor package may further include an adhesive member on the surface of the IC device and the surface of the mold to cover the surface profile modifier, the surface profile modifier enlarging a contact area with the adhesive member, and a heat dissipating member on the adhesive member.

The IC device may include a chip stack structure in which semiconductor chips are stacked in a vertical direction.

An additional package may be connected to the contact pads of the circuit board by a joint structure, the additional package including an additional circuit board, at least an additional IC device mounted on the additional circuit board and an additional heat dissipating member that dissipates heat from the additional IC device, the additional heat dissipating member being connected to the surface profile modifier.

Embodiments are also directed to a method of manufacturing a semiconductor package including providing a mother circuit board having a plurality of mounting areas, each mounting area including an inner circuit pattern and a plurality of contact pads that are connected to the inner circuit pattern, mounting integrated circuit (IC) devices on the mother circuit board in such a manner that respective ones of the IC devices make contact with respective ones of the contact pads at each mounting area of the mother circuit board, forming a mold on a whole surface of the mother circuit board to cover the IC devices, exposing a surface of the IC devices by planarizing the IC devices and the mold, forming a surface profile modifier on the exposed surfaces of the IC devices and on an upper surface of the mold, and cutting the mother circuit board to separate the mounting areas into units.

Forming the surface profile modifier may include coating a liquid mixture including thermally conductive particles and a volatile solvent onto a whole surface of the mother circuit board including the exposed surface of the IC devices and the upper surface of the mold, and vaporizing the volatile solvent from the liquid mixture coated on the mother circuit board such that the thermally conductive particles remain on the mother circuit board, the thermally conductive particles being randomly distributed.

Forming the surface profile modifier may include forming a mask pattern on a whole surface of the mother circuit board such that portions of the surfaces of the IC devices and the mold not covered by the mask pattern, injecting thermally conductive particles onto the mother circuit board having the mask pattern, such that the thermally conductive particles are bonded to the portions of the surface of the IC devices and the surface of the mold that are not covered by the mask pattern and are bonded onto the mask pattern, and removing the mask pattern from the mother circuit board, thereby forming a particle pattern on the IC devices and the mold.

Injecting the thermally conductive particles may be performed by using a sprayer or a vacuum absorber.

Forming the surface profile modifier may include forming a thermally conductive layer on a whole surface of the mother circuit board, forming a heat transfer pattern on the mother circuit board by patterning the thermally conductive layer, such that portions of the surface of the IC devices and the surface of the mold are not covered by the heat transfer pattern, and forming a plurality of recesses on the portions of the surface of the IC devices and the surface of the mold that are not covered by the heat transfer pattern, by a surface process using the heat transfer pattern as a process mask.

The surface process may include one of a dry etching process and a sand blasting process.

Embodiments are also directed to a semiconductor package including an integrated circuit (IC) device on a circuit board, the IC device having a top surface, a mold on the circuit board, the mold being adjacent to the IC device, the mold having a surface, the top surface of the IC device and the surface of the mold being modified by a surface profile modifier that increases a surface area of the top surface of the IC device and a surface area of surface of the mold, an adhesive member on the surface of the IC device and the surface of the mold to cover the surface profile modifier, and a heat dissipating member on the adhesive member.

The surface profile modifier may include thermally conductive particles distributed on the top surface of the IC device and the surface of the mold.

The surface profile modifier may include a heat transfer pattern on the top surface of the IC device and the surface of the mold. Portions of the top surface of the IC device and the surface of the mold being exposed through the heat transfer pattern.

The portions of the top surface of the IC device and surface of the mold that are exposed through the heat transfer pattern may include a plurality of recesses.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
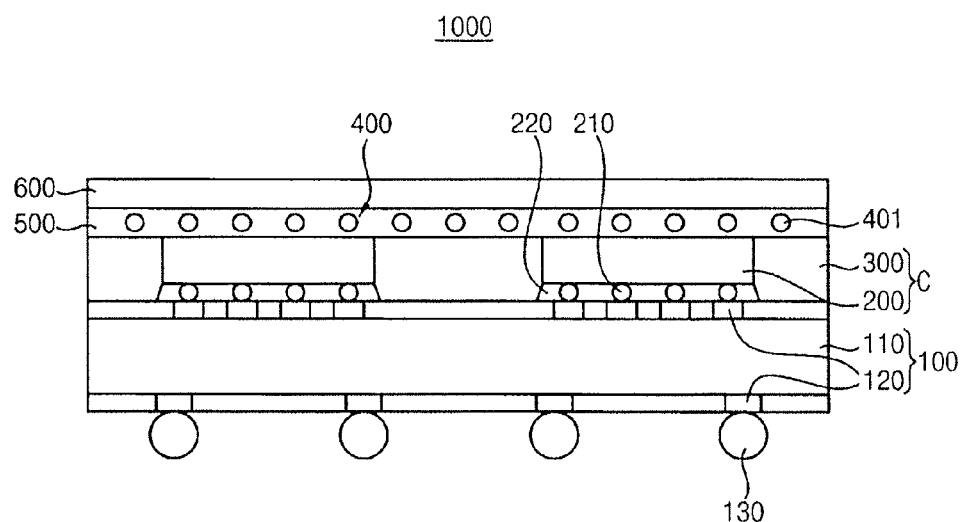
FIG. 1 illustrates a cross-sectional view depicting a semiconductor package in accordance with an example embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer, or section from another region, layer or section. Thus, a first element, component, region, layer, or section discussed below could be termed a second element, component, region, layer or section without departing from the teachings of the present invention.

Spatially relative terms, such as "lower," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures.

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Semiconductor Package

Figure 2:
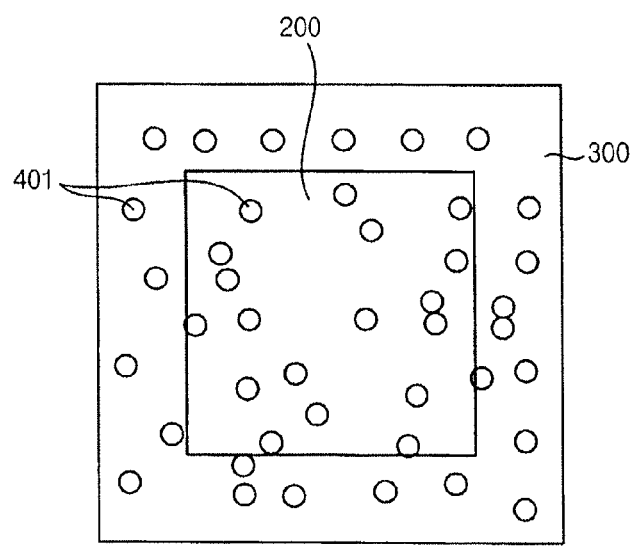
FIG. 2 illustrates a plan view depicting a surface profile modifier of the semiconductor package shown in FIG. 1.

FIG. 1 illustrates a cross-sectional view depicting a semiconductor package in accordance with an example embodiment. FIG. 2 illustrates a plan view depicting a surface profile modifier of the semiconductor package shown in FIG. 1.

Referring to FIGS. 1 and 2, the semiconductor package 1000 in accordance with an example embodiment may include a circuit board 100 having an inner circuit pattern and a contact pad 120 connected to the circuit pattern, at least one integrated circuit (IC) device 200 mounted on the circuit board 100 in such a configuration that the contact pad 120 may make contact with the IC device 200, a mold 300 that fixes the IC device 200 to the circuit board 100 such that an upper surface of the IC device 200 may be exposed, and a surface profile modifier 400 arranged on the upper surface of the IC device 200 and an upper surface of the mold 300, thereby enlarging a surface area for dissipating heat and providing an adhesive contact in the semiconductor package 1000.

In an example embodiment, the circuit board 100 may include a body 110 having a plate shape with a sufficient rigidity and including insulating and heat-resistive materials the inner circuit pattern having a plurality of conductive lines, and the contact pad 120 on front and rear surfaces of the body 110 and connected to the circuit pattern.

For example, the body 110 may include a thermosetting plastic plate such as an epoxy resin plate or a polyimide plate. In other implementations, the body 110 may include a plate on which a heat-resistive organic film such as a liquid crystal polyester film or a polyamide film may be coated. The circuit pattern may include a plurality of conductive lines or wirings that may be arranged in the body 110. The circuit pattern may include a power line for applying an electric power to the circuit pattern, a plurality of signal lines for transferring signals to the circuit pattern and a ground line for electrically grounding the signal lines and the power line. The conductive lines or the wirings may be electrically insulated from one another by a plurality of insulation interlayers that may be arranged on the front and rear surfaces of the body 110.

The contact pad 120 may be plural in number and may be arranged on the front and rear surfaces of the body 110. The contact pads 120 may be electrically separated from one another by the insulation interlayer in such a configuration that an upper portion of the contact pad 120 is exposed to surroundings. An external structure may make contact with the contact pad 120, and thus, the external structure may be connected with the circuit pattern of the circuit board 100 through the contact pad 120. In the present example embodiment, the contact pads 120 may include upper pads arranged on the front surface of the body 110 and lower pads arranged on the rear surface of the body 110. The upper pads may make contact with the IC device 200, and the lower pads may make contact with the external structure through a contact terminal 130 such as a solder ball. The circuit board 100 may include a printed circuit board (PCB) in which the circuit pattern may be printed on the body 110 by a printing process.

The IC device 200 may include an active device arranged on the circuit board. The IC device 200 may generate heat. For example, electrical energy may be transferred to the active device, and heat may be generated by the active device through the electrical operations such as amplifications and electrical oscillations.

The IC device 200 may include a plurality of conductive structures stacked on a semiconductor substrate, such as a silicon wafer, using a plurality of insulation interlayers and a plurality of wiring structures separated from the conductive structures by the insulation interlayers and transferring signals to the conductive structures.

As examples, the conductive structure may include a unit structure of a DRAM device having a transistor and a capacitor or a unit block of a flash memory device having string transistors, selection transistors, and ground transistors.

The wiring structure may include a metal plug penetrating through the insulation interlayer and making contact with the conductive structure and a metal wiring extending on the insulation interlayer and connected to the metal plug. The metal wiring may include a signal line for transferring input/output signals to the conductive structure, a power line for applying an electric power to the conductive structure, and a ground line for electrically grounding the conductive structure.

The input/output signal and the ground signal may be transferred to the conductive structure via a bump structure 210 that may be connected to the metal wiring and to the contact pad 120 of the circuit board 100. The bump structure 210 may be bonded to the circuit board 100 by a heat treatment such as a reflow process. A gap space between the circuit board 100 and the bump structure 210 may be filled up with an under-filling layer. Thus, the bump structure 210 may be stably bonded to the circuit board 100.

The IC device 200 may be a single chip structure having a single semiconductor chip or a chip stack structure having a plurality of semiconductor chips that are stacked in a vertical direction.

The single chip structure may include a memory device, such as a DRAM device or a flash memory device, or a logic device for driving the memory device. In addition, the single chip structure may be a chip scale package (CSP) having a single semiconductor chip, such as a wafer level chip scale package (WLCSP) in which a plurality of chips and the bump structures are bonded on a single wafer and the assembly of the chips and the bump structures are separated into pieces according to a unit of the chip. In the present example embodiment, the single chip structure may include a flip chip structure the active face of which may face the circuit board 100.

The IC device 200 may also be a single package structure that includes a plurality of memory chips or at least one memory chip and at least one logic chip that are stacked on a single circuit board. For example, the logic chip may include a wafer-level chip and the memory chip may include a sawed chip. A plurality of the sawed chips may be stacked on the wafer-level logic chip to thereby provide the IC device 200.

The mold 300 may fix the IC device 200 to the circuit board 100. The mold 100 may include an insulating resin having a sufficient rigidity, so that the IC device 200 may be sufficiently protected from external surroundings. For example, the mold 300 may include an epoxy molding compound (EMC) that covers the front surface of the body 110 of the circuit board 100.

A surface of the IC device 200 may be coplanar with an upper surface of the mold 300. For example, the mold 300 may formed to cover the IC device and then may be planarized until the surface the IC device 200 is exposed. As an example, the exposed surface of the IC device may be electrically insulating. If IC device 200 includes a flip chip structure, a rear surface of the IC device 200 may be exposed through the mold 300. In other implementations, the surface of the IC device 200 may not be coplanar with the upper surface of the mold 300, so that a stepped portion may be provided between the IC device 200 and the mold 300.

In such a case, the IC device 200 may be arranged on the circuit board 100 in a face-up structure in which the active face of the IC device 200 is directed upwards or in a face-down structure in which the active face of the IC device 200 is directed downwards.

In the case that the IC device 200 is arranged in the face-down structure such as the flip chip structure, a rear portion of the IC device 200 may be planarized together with the mold 300, and thus, an overall thickness of the IC device 200 may be reduced. In case that the IC device 200 is arranged in the face-up structure, a passivation layer of the IC device 200 may be planarized together with the mold 300.

The surface profile modifier 400 may be arranged on the surfaces of the IC device 200 and the mold 300. A thermal dissipation area through which the heat is dissipated outwards from the IC device 200 may be sufficiently enlarged. In addition, a contact area with which the external structure makes contact may also be enlarged according to an increased surface area of the surface profile modifier 400. Further, the surface profile modifier 400 may also control a surface roughness of the mold 300 and the IC device 200. The surface profile modifier 400 may be continuously arranged along the surfaces of the IC device 200 and the mold 300. Thus, various configurations and modifications may be provided to the surface profile modifier 400 in which the surface profile modifier 400 is provided continuously on the IC device 200 and the mold 300.

In the present example embodiment, the surface profile modifier 400 may be in the form of particles having high thermal conductivity and a large surface area, thereby increasing the thermal dissipation capability. For example, the surface profile modifier 400 may include a plurality of heat conductive particles 401 that are randomly distributed on the surfaces of the IC device 200 and the mold 300.

The heat conductive particles 401 (also referred to herein as "thermally conductive particles") may be randomly distributed on the surface of the semiconductor package 100, for example, on the surfaces of the IC device 200 and the mold 300. Thus, when an external structure is provided on the semiconductor package 1000, the contact area between the external structure and the semiconductor package 1000 may be enlarged according to an increased surface area provided by the heat conductive particles 401. Enlarging the contact area between the external structure and the semiconductor package 1000 may minimize warpage due to the difference of the thermal expansion between the external structure and the IC device 200, thereby increasing the reliability and stability of the semiconductor package 1000 to which the external structure may be installed. In addition, each of the heat conductive particles 401 may function as an individual thermal dissipating member for dissipating the heat generated from the IC device 200, thereby increasing the thermal dissipation capability of the semiconductor package 1000.

For example, the heat conductive particle 401 may comprise highly thermally conductive materials such as copper, gold, aluminum, silicon, diamond, or combinations thereof. A mixture of the highly thermally conductive material and a volatile solvent may be coated on the surfaces of the IC device 200 and the mold 300, and then, the volatile solvent may be evaporated off from the IC device 200 and the mold 300. Thus, only the highly thermally conductive materials may remain on the surfaces of the IC device 200 and the mold 300. Thereby, the heat conductive particles may be randomly distributed on the surfaces of the IC device 200 and the mold 300. In other implementations, the heat conductive particles 401 may be injected onto the surfaces of the IC device 200 and the mold 300 under high pressure. The heat conductive particles 401 may be shaped as spheres having a diameter of about 1 μm to about 100 μm, thereby increasing the contact area and the thermal dissipating area as according to the circumferential surfaces of the particles 401. The number of heat conductive particles 401 may be varied according to an adhesive to be used with the semiconductor package 1000 and the external structure to be installed on the semiconductor package 1000.

While the present example embodiment discloses that the heat conductive particles 401 may be randomly distributed on the surfaces of the IC device and the mold 300, in other implementations, a regular arrangement such as a pattern may be provided with respect to the heat conductive particles 401. For example, a mask pattern may be provided to cover the surfaces of the IC device 200 and the mold 300 such that the surface of the IC device 200 and the mold 300 are partially exposed according the mask pattern. Then, the heat conductive particles 401 may be supplied onto the mask pattern, and the mask pattern may be removed from the IC device 200 and the mold 300. By this method, the heat conductive particles 401 may be coated on the exposed portion of the IC device 200 and the mold 300 in the form of a regular pattern instead of as randomly distributed particles.

An adhesive member 500 may be provided on the IC device 200 and the mold 300 to cover the heat conductive particles 401, and a dissipating member 600 may be provided on the adhesive member 500.

The dissipating member 600 may dissipate the heat generated from the IC device 200 outwards from the semiconductor package 1000.

The dissipating member 600 may have various configurations according to the usage and structure of the semiconductor package 1000. For example, the dissipating plate 600 may include a thermally conductive thin layer making direct contact with the IC device 200 and a water cooling type or an air cooling type dissipating structure arranged over the IC device 200. A thermally conductive medium may be interposed between the dissipating structure and the IC device 200. In the present example embodiment, the dissipating member 600 may include a thin layer pattern making contact with the IC device 200 and including copper or aluminum. For example, the thermal expansion coefficient and the Young's modulus of the dissipating member 600 may be substantially the same as those of a silicon substrate of the IC device 200, and the thermal conductivity of the dissipating member 600 may be higher than that of the circuit board 100 and the mold 300. Therefore, warpage of the circuit board and the silicon substrate of the IC device may be sufficiently prevented or reduced when the semiconductor package 1000 is operated and thus a large amount of the heat may be dissipated from the IC device 200.

The adhesive member 500 may be interposed between the dissipating member 600 and a combination of the IC device 200 and the mold 300 (referred to as "combination C"). A plurality of the heat conductive particles 401 may be distributed on the combination C of the IC device 200 and the mold 300, so that the heat conductive particles 401 are distributed in the adhesive member 500. Thus, the dissipating member 600 may be adhered to the combination C of the IC device 200 and the mold 300 and the heat generated from the IC device 200 may be dissipated outwards through the dissipating member 600.

The adhesive member 500 may include an insulating material such as an epoxy resin, a polyimide resin or a permanent photoresist layer. The heat transfer from the IC device 200 to the adhesive member 500 may be sufficiently prevented, and heat generated from the IC device 200 may be dissipated through the dissipating member 600. In addition, the adhesive member 500 may further include a supplementary dissipating agent having good thermal conductivity. Examples of the supplementary dissipating agent may include a thermal interface material (TIM) unit, a metal paste and nano-sized particles. An electrically conductive member may be further arranged in the adhesive member 500 and an external ground wiring may be connected to the electrical conductive member, thereby improving electromagnetic interference (EMI) characteristics and noise characteristics of the semiconductor package 1000.

According to the semiconductor package 1000, the heat conductive particles 401 may be distributed in the adhesive member 500. Thus, the dissipating area for dissipating the heat from the IC device 200 and an adhesive area with which the adhesive member 500 makes contact may be sufficiently enlarged as much as the circumferential surface of the heat conductive particles 401, thereby improving the dissipating characteristics and adhesive characteristics of the semiconductor package 1000. In addition, the increase of the adhesive area may minimize the difference in thermal expansion between the dissipating member 600 and the IC device 200, thereby preventing warpage of the silicon substrate of the IC device 200. Therefore, the heat conductive particles 401 may improve the dissipating characteristics and increase the mechanical stability and reliability of the semiconductor package 1000.

The surface profile modifier 400 for enlarging the dissipating area and the contact area with the adhesive member may be variously modified according to the shape and structure of the external structure that makes contact with the semiconductor package 1000 and the usage environments of the semiconductor package 1000.

Figure 3A:
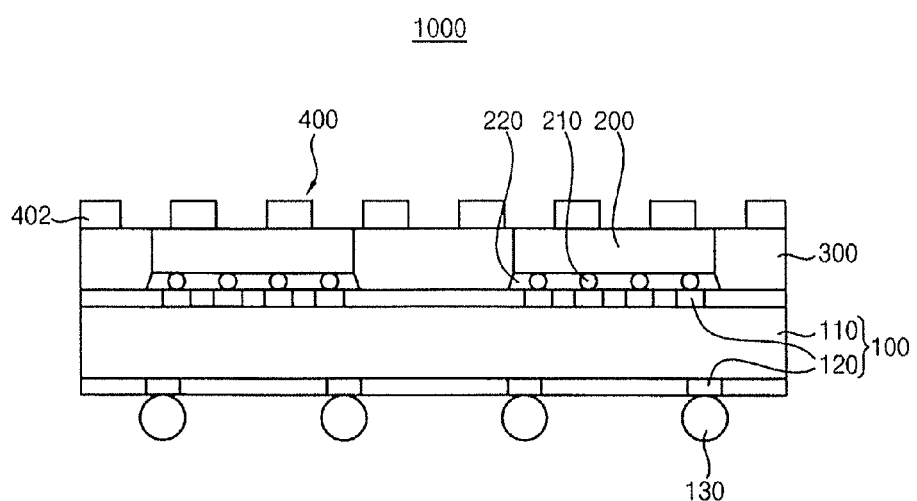
FIGS. 3A to 3B illustrate cross-sectional views depicting modifications of the surface profile modifier of the semiconductor package shown in FIG. 1 in accordance with an example embodiment.
Figure 3B:
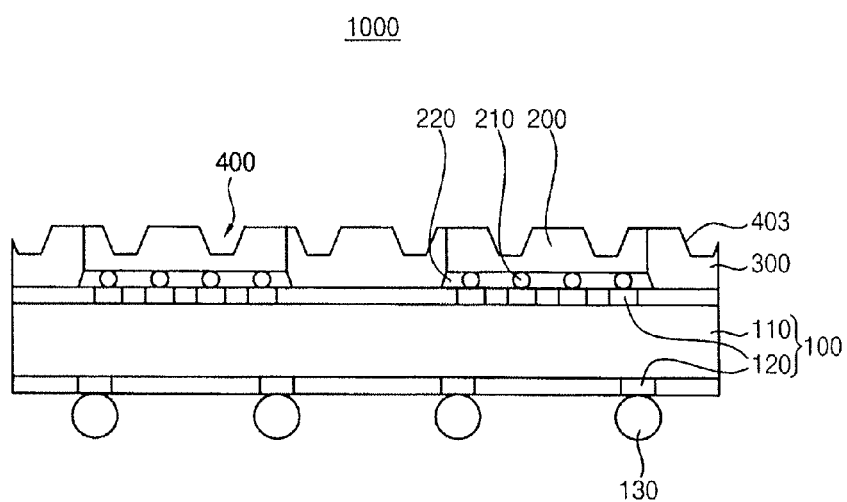

FIGS. 3A to 3B illustrate cross-sectional views depicting modifications of the surface profile modifier of the semiconductor package shown in FIG. 1 in accordance with an example embodiment.

Referring to FIG. 3A, a modification of the surface profile modifier 400 may include a heat transfer pattern 402 regularly arranged along the surfaces of the IC device 200 and the mold 300.

For example, a material layer having high thermal conductivity may be formed on the surfaces of the IC device and the mold 300, and the material layer may be patterned into the heat transfer pattern 402. The heat transfer pattern 402 may include a metal pattern comprising copper, gold, aluminum, or combinations thereof. In other implementations, the heat transfer pattern 402 may include a silicon oxide pattern. Thus, the dissipation area and the contact area may be enlarged as much as the surface area of the heat transfer pattern 402.

As illustrated in FIG. 3B, another modification of the surface profile modifier 400 may include a plurality of recesses 403 arranged along the surfaces of the IC device 200 and the mold 300.

For example, a mask pattern may be formed on the surfaces of the IC device 200 and the mold 300, and a plurality of the recesses 403 according the shape of the mask pattern may be partially formed on the IC device 200 and the mold 300 by a surface treatment. The depth and gap distance of the recesses 403 may be determined by controlling the conditions of the surface treatment. In the present example embodiment, the surface treatment may include a dry etching process such as a plasma etching process using the mask pattern as an etching mask or a sand blasting process. Thus, the dissipating area and the contact area may be enlarged as much as the inner surfaces of the recesses 403.

Figure 4A:
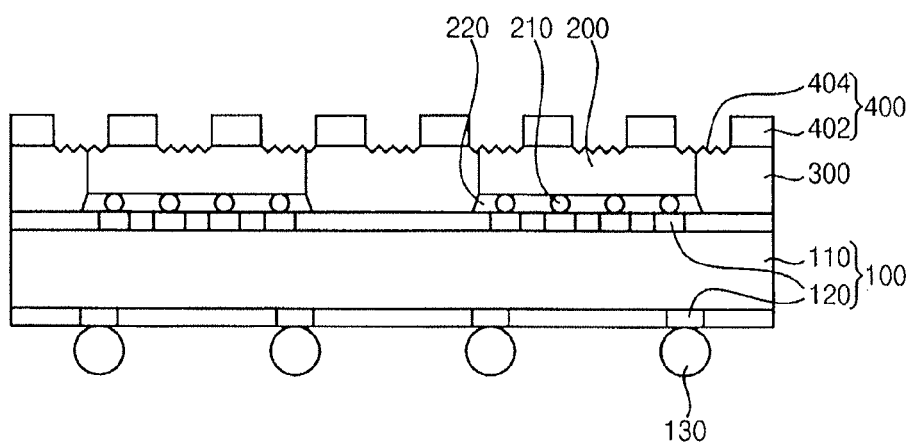
FIGS. 4A to 4B illustrate cross-sectional views depicting other modifications of the surface profile modifier of the semiconductor package shown in FIG. 1 in accordance with another example embodiment.
Figure 4B:
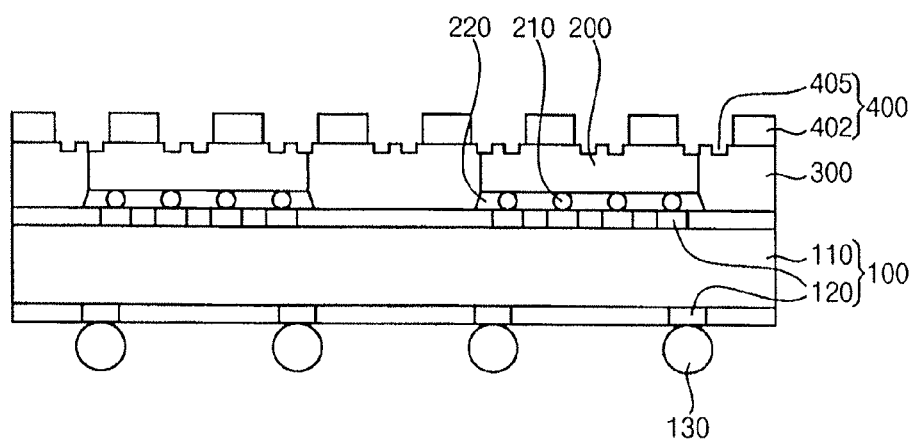

FIGS. 4A to 4B illustrate cross-sectional views depicting other modifications of the surface profile modifier of the semiconductor package shown in FIG. 1 in accordance with another example embodiment.

Referring to FIGS. 4A and 4B, the surface profile modifier 400 according to these modifications may include the heat transfer pattern 402 regularly arranged along the surfaces of the IC device 200 and the mold 300 as shown in FIG. 3A and a plurality of subsidiary recesses 404 or a plurality of subsidiary studs 405 exposed between the heat transfer pattern 402.

For example, the heat transfer pattern 402 may be formed as a plurality of lines extending along the surfaces of the IC device 200 and the mold 300. The lines may be spaced apart by an interval. The surfaces of the IC device 200 and the mold 300 may be partially exposed through the heat transfer pattern 402. A plurality of the subsidiary recesses 404 may be formed on the exposed surfaces of the IC device and the mold 300 as shown in FIG. 4A. A plurality of the subsidiary studs 405 may also be formed on the exposed surface of the IC device 200 and the mold 300 as shown in FIG. 4B. Accordingly, the dissipating area and the contact area may be enlarged as much as the inner surfaces of the subsidiary recesses 404 or the subsidiary studs 405, as well as the surface area of the heat transfer pattern 402. Therefore, the heat conductive particles 401 may improve the dissipating characteristics and increase the mechanical stability and reliability of the semiconductor package 1000.

Figure 5:
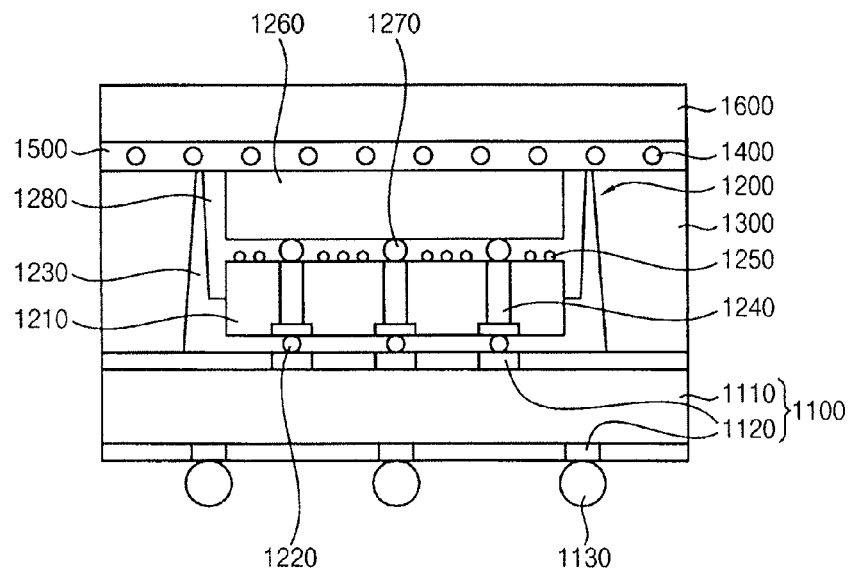
FIG. 5 illustrates a cross-sectional view depicting a semiconductor package in accordance with another example embodiment.

FIG. 5 illustrates a cross-sectional view depicting a semiconductor package in accordance with another example embodiment. The semiconductor package in FIG. 5 may have substantially the same structures as the semiconductor package 1000 shown in FIG. 1, except that the IC device may include a chip stack package.

Referring to FIG. 5, the semiconductor package 2000 in accordance with this example embodiment may include a circuit board 1100, a chip stack structure 1200 mounted on the circuit board 1100 and having first and second semiconductor chips 1210 and 1260, a mold 1300 fixing the chip stack structure 1200 to the circuit board 1100, a surface profile modifier 1400 arranged on surfaces of the chip stack structure 1200 and the mold 1300, an adhesive member 1500 covering the surface profile modifier 1400 and a dissipating member 1600 arranged on the adhesive member 1500.

For example, the chip stack structure 1200 may include a first chip 1210 and a second chip 1260. The second chip 1260 may be stacked on the first chip 1210 and may be connected to the first chip 1210 through a penetration electrode 1240. The first chip 1210 may be connected to the circuit board 1100 via a first bump structure 1220, and the second chip 1260 may be connected to the penetration electrode 1240 via a second bump structure 1270. Thus, the first and the second chips 1210 and 1260 may be electrically connected to each other through the penetration electrode 1240 and the second bump structure 1270. As examples, the first chip 1210 may include a logic chip such as a mobile CPU that may generate a relatively smaller amount of heat, and the second chip 1260 may include a memory chip such as a mobile dynamic random access memory (DRAM) device, a flash memory device and a phase-changeable random access memory (PRAM) device that may generate a relatively larger amount of heat.

A first gap space between the first chip 1210 and the circuit board 1100 may be filled up with a first under-filling layer 1230, and a second gap space between the first chip 1210 and the second chip 1260 may be filled up with a second under-filling layer 1280. A relative motion between the first and the second chips 1210 and 1260 and between the first chip 1210 and the circuit board 1100 may be sufficiently prevented or reduced by the first and the second under-filling layers 1230 and 1280. The chip stack structure 1200 may be fixed to the circuit board 1100 by the mold 1300.

A first surface profile modifier 1250 may be selectively arranged on the first chip 1210. The dissipating area for dissipating the heat from the first chip 1210 and the contact area to which the second under-filling layer 1280 is adhered may be enlarged as much as the surface area of the first surface profile modifier 1250. The heat may be much more efficiently dissipated outwards from the first chip 1210 through the first surface profile modifier 1250, and the adhesive force between the first and the second chips 1210 and 1260 may be reinforced due to the enlargement of the contact area with the first under-filling layer 1280. However, the first surface profile modifier 1250 may be omitted in case that the first and the second chips 1210 and 1260 are stacked into the chip stack structure 1200 on the same wafer before a dicing process and thus are coupled into one body. In the present example embodiment, the first surface profile modifier 1250 may include the heat conductive particles 401 shown in FIG. 1 and the heat transfer pattern 402 and the modifications of the heat transfer pattern illustrated in FIGS. 3A to 4B.

A second surface profile modifier 1400 may be selectively arranged on the chip stack structure 1200 and the mold 1300, thereby enlarging the dissipating area for dissipating heat from the chip stack structure 1200 and the contact area with which the adhesive member 1500 make contact. The second surface profile modifier 1400 may also include the heat conductive particles 401 shown in FIG. 1 and the heat transfer pattern 402 and the modifications of the heat transfer pattern illustrated in FIGS. 3A to 4B.

A thermal via connected with the first surface profile modifier 1250 and the dissipating member 1600 may be further provided with semiconductor package 2000, thereby improving the dissipating capability of the first chip 1210. For example, the second surface profile modifier 1400 may make contact with the thermal via in the adhesive member 1500, thereby much more improving the dissipating capability of the first chip 1210. While the present example embodiment discloses that the first and the second chips 1210 and 1260 may be stacked in the chip stack structure 1200, in other implementations, three or more chips may be stacked in the chip stack structure 1200 according to the consumer desires and usage environments of the semiconductor package 2000. In such a case, the surface profile modifier and the thermal via may be provided on a surface of each chip of the semiconductor package so as to improve the dissipating capability of each chip.

The adhesive member 1500 may be present on a whole surface of the chip stack structure 1200 and the mold 1300 in such a way that the second surface profile modifier 1400 is covered with the adhesive member 1500. The dissipating member 1600 may be arranged on the adhesive member 1500. The adhesive member 1500 and the dissipating member 1600 may have substantially the same structures as the adhesive member 500 and the dissipating member 600 of the semiconductor package 1000 illustrated in FIG. 1. Thus, a detailed description of similar features of the adhesive member 1500 and the dissipating member 1600 may not be repeated.

According to the semiconductor package 2000, the surface profile modifier 1400 may be arranged on the surfaces of the mold 1300 and each chips of the chip stack structure 1200. The dissipating area for dissipating the heat from the chips of the chip stack structure 1200 and an adhesive area with which the adhesive member 1500 and each under-filling layers make contact may be sufficiently enlarged as much as the surface of the surface profile modifier 1400, thereby improving the dissipating characteristics and adhesive characteristics of the semiconductor package 2000. Therefore, the surface profile modifier 1400 may improve the dissipating characteristics and sufficiently prevent or reduce warpage of the chip stack structure 1200 that may occur due to a difference of the thermal expansion between the chip stack structure 1200 and the dissipating member 1600.

Figure 6:
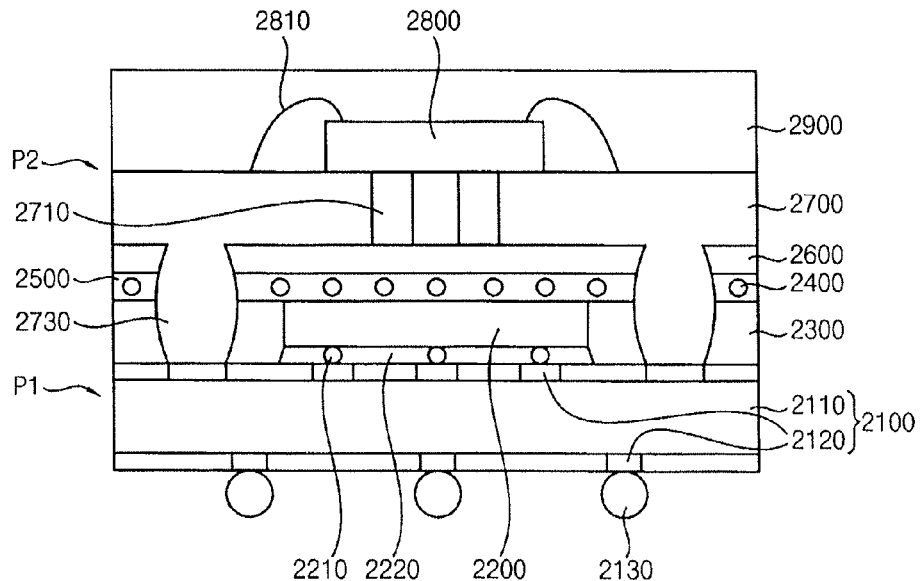
FIG. 6 illustrates a cross-sectional view depicting a semiconductor package in accordance with still another example embodiment.

FIG. 6 illustrates a cross-sectional view depicting a semiconductor package in accordance with still another example embodiment. In FIG. 6, an additional package may be stacked on the semiconductor package 1000 shown in FIG. 1, thereby providing a multi-stack package such as a package on package (POP). The semiconductor package in FIG. 6 may have substantially the same structure as the semiconductor package shown in FIG. 1, except for the additional package installed on the semiconductor package 1000.

Referring to FIG. 6, the semiconductor package 3000 in accordance with this example embodiment may include a first package P1 and a second package that is arranged on the first package P1.

The first package P1 may have substantially the same structure as the semiconductor package 1000 shown in FIG. 1. For example, the first package P1 may include a circuit board 2100 having contact pads 2120 on front and rear surfaces of the body 2110 and solder balls 2130 for communicating with an external structure, a first integrated circuit (IC) device 2200 mounted on the circuit board 2100 via a first bump structure 2210, a first mold 2300 fixing the first IC device 2200 to the circuit board 2100, a surface profile modifier 2400 arranged on the first IC device 2200 and the first mold 2300, thereby enlarging a surface area for thermal dissipation and adhesive contact, an adhesive member 2500 on the first IC device 2200 and the first mold 2300 and a dissipating member 2600 adhered to the adhering member 2500. The above first package P1 may have the same structure as the semiconductor package 1000 shown in FIG. 1, and thus a detailed description of similar features of the first package P1 will not be repeated.

The second package P2 may include a second circuit board 2700 having an inner circuit pattern and a plurality of contact pads connected to the circuit pattern, a second IC device 2800 mounted on the second circuit board 2700 in such a way that the contact pad of the circuit board 2700 makes contact with the second IC device 2800, and a second mold 2900 fixing the second IC device 2800 to the second circuit board 2700.

Various suitable circuit boards may be used as the second circuit board 2700 such that the second IC device 2800 is mounted on the circuit board with sufficient stability and a contact terminal for electrically communicating with external structures is sufficiently provided with the circuit board. In the present example embodiment, the second circuit board 2700, like the first circuit board 2100, may include a printed circuit board (PCB).

For example, the second circuit board 2700 may further include a thermal via 2710 penetrating therethrough and transferring the heat generated from the second IC device 2800. In the present example embodiment, the thermal via 2710 may make contact with the dissipating member 2600 of the first package P1. The heat generated from the second IC device 2800 may also be dissipated through the dissipating member 2600 of the first package P1. A second adhesive member may be further interposed between the second circuit board 2700 and the dissipating member 2600. The second circuit board 2700 may be stably adhered to the first package P1.

The second IC device 2800 may include various semiconductor chips. For example, the second IC device 2800 may include an active chip set in which at least a memory chip and a logic chip are integrated into a single chip set. Heat may be generated from the second IC device 2800 as the semiconductor package 3000 operates.

The second IC device 2800 may be mounted on the second circuit board 2700 in such way that the inner circuit pattern is electrically connected to the second IC device 2800. In the present example embodiment, the second IC device 2800 may be mounted as a face-up structure in which the active face of the IC device faces upwards and may be electrically connected to the contact pads of the second circuit board 2700 through bonding wires 2810. The second IC device 2800 may be fixed onto the second circuit board 2700 and may be protected from surroundings by the second mold 2900. The second mold 2900 may have substantially the same structure as the first mold 2100, and thus any further detailed description of similar features of the second mold 2900 will not be repeated.

While the second IC device 2800 may be connected to the second circuit board 2700 through the bonding wires 2810, in other implementations, other interconnectors may be used for connecting the second IC device 2800 with the second circuit board 2700 in place of the bonding wires 2810 according to the requirements of the semiconductor package 3000. For example, the second IC device 2800 may be configured as a face-down structure in which the active face faces downwards and make contact with the second circuit board 2700 via a second bump structure. In addition, the second IC device 2800 may also include a chip stack structure in which a plurality of the semiconductor chips are stacked.

The first and the second packages P1 and P2 may be interconnected with each other by a joint structure 2730 that is connected with the contact pad 2120 of the first circuit board 2100 and a contact pad of the second circuit board 2700. The joint structure 2730 may include a solder joint having good electrical conductivity. In such a case, the first mold 2300 may function as an under-filling layer filling up the gap space between the first and the second circuit boards 2100 and 2700. The joint structure 2730 may be stably fixed between the first and the second circuit boards 2100 and 2700.

The surface profile modifier 2400 may be arranged on the first IC device 2100 and the first mold 2300, thereby enlarging the surface area for thermal dissipation and adhesive contact. For example, the second package P2 may be vertically stacked on the first package P1. Accordingly, the enlargement of the surface area with which the adhesive member 2500 makes contact may enable the load of the second package P2 to be distributed on a larger area and may enable thermal strain that may be caused by a difference of thermal expansion ratios to be sufficiently absorbed. For example, the surface profile modifier 2400 may be arranged on the first mold 2300 as well as on the first IC device 2100. The load of the second package P2 may be more uniformly distributed on a whole surface of the first package P1. Accordingly, the heat from the first IC device 2200 may be efficiently dissipated out of the semiconductor package 3000, and the first and the second packages P1 and P2 may be sufficiently adhered to each other with high stability, thereby sufficiently preventing or reducing warpage of the silicon substrate of the first IC 2100.

The surface profile modifier 2400 may include the heat conductive particles 401 illustrated in FIG. 1 and the heat transfer pattern 402 and the modifications of the heat transfer pattern having the recess and stud illustrated in FIGS. 3A to 4B.

While the present example embodiment discloses that the surface profile modifier may be provided on the chip stack package and the multi-stack package, in other implementations, the surface profile modifier may also be provided on various other semiconductor packages known in the art. For example, the surface profile modifier may also be provided on a system in package (SIP) in which a plurality of the active devices and passive devices are mounted on the same circuit board and thus individually function as an independent operation module. In such a case, the surface profile modifier may be arranged on the surfaces of the chips of the active devices and on the surface of a mold that fixes the active devices and the passive devices to the circuit board.

In addition, when the SIPs are mounted on a mother board of an electronic system in such a way that each of the SIP functions as a respective operation module of the electronic system and the active devices of each SIP makes contact with a module housing or a system housing, the surface profile modifier on the active devices may enlarge the surface area for dissipating heat to the housing from the active device and may enlarge the contact area between the SIP and the housing. Therefore, an electronic system including the surface profile modifier-attached SIP may have improved heat dissipation and adhesion capability.

Method of Manufacturing the Semiconductor Package

Figure 7:
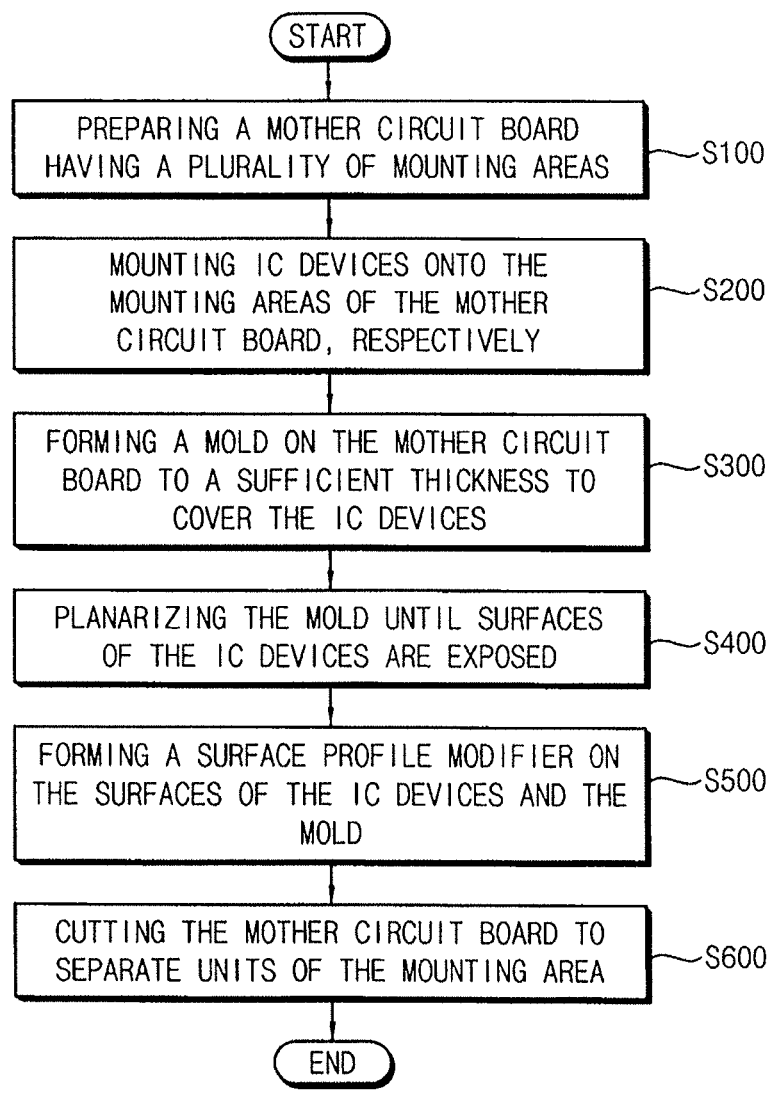
FIG. 7 illustrates a flow chart showing processing steps for a method of manufacturing the semiconductor package shown in FIG. 1.
Figure 8:
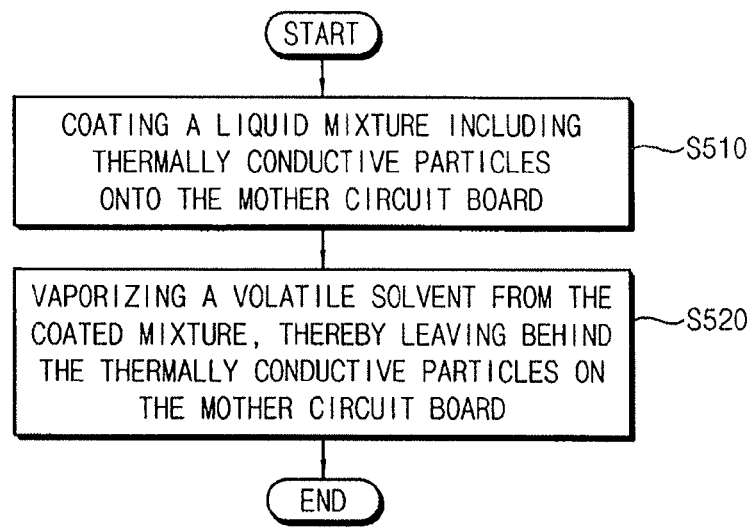
FIG. 8 illustrates a flow chart showing processing steps for a method of forming the surface profile modifier shown in FIG. 7 in accordance with an example embodiment.
Figure 9:
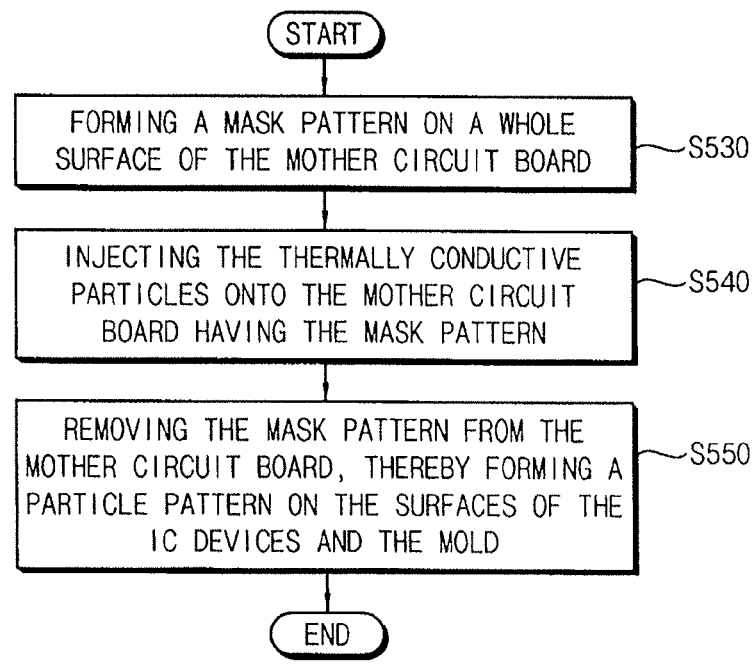
FIG. 9 illustrates a flow chart showing processing steps for a method of forming the surface profile modifier shown in FIG. 7 in accordance with another example embodiment.
Figure 10:
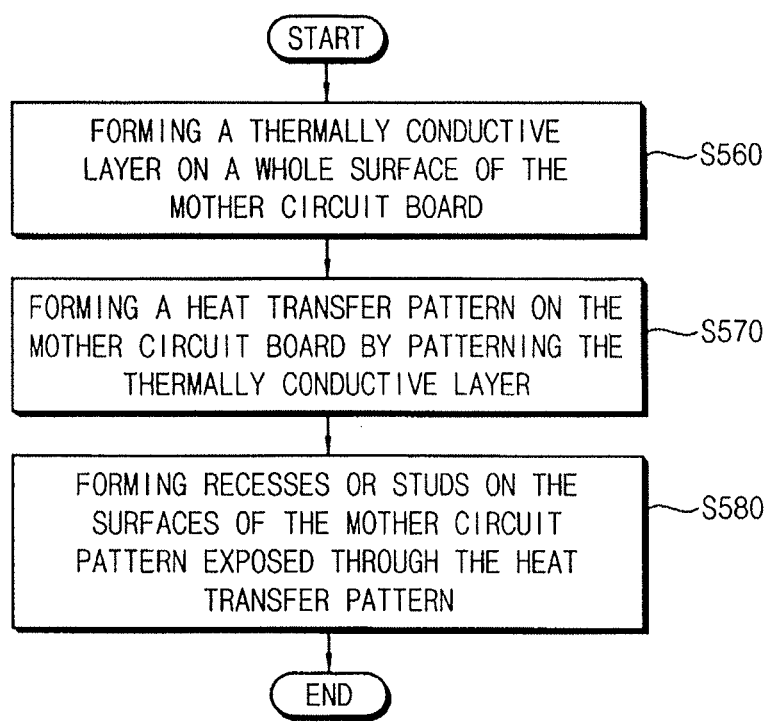
FIG. 10 illustrates a flow chart showing processing steps for a method of forming the surface profile modifier shown in FIG. 7 in accordance with still another example embodiment.

FIG. 7 illustrates a flow chart showing processing stages for a method of manufacturing the semiconductor package shown in FIG. 1. FIG. 8 is a flow chart showing processing stages for a method of forming the surface profile modifier shown in FIG. 7 in accordance with an example embodiment. FIG. 9 is a flow chart showing processing stages for a method of forming the surface profile modifier shown in FIG. 7 in accordance with another example embodiment. FIG. 10 is a flow chart showing processing stages for a method of forming the surface profile modifier shown in FIG. 7 in accordance with still another example embodiment.

Referring to FIGS. 1 and 7, a mother circuit board defined into a plurality of mounting areas may be prepared (S100) for manufacturing the semiconductor package 1000. Then, a plurality of the IC devices 200 may be mounted onto the mother circuit board in such a way that the IC devices 200 may be positioned on the mounting areas, respectively, (S200).

The mother circuit board may be loaded onto a board support of a chip mounting apparatus from a magazine holding a plurality of mother circuit boards. A wafer on which a plurality of IC devices having semiconductor chips are positioned may be loaded onto a wafer support of the chip mounting apparatus from a wafer cassette holding a plurality of the wafers. The mounting areas of the mother circuit board may be defined by scribe lines. A plurality of the contact pads 120 may be arranged on each mounting area. The IC devices may be individually picked up from the wafer, and the bump structures 210 of the semiconductor chip may be coated with flux through a flux coating process. Then, each IC device may be mounted on a respective mounting area in such a way that the contact pads 120 make contact with the respective bump structures 210. Thereafter, a heat treatment such as a reflow process may be performed on the mother circuit board on which the IC devices are mounted, and the gap space between the IC devices and the mother circuit board may be filled up with an under-filing layer. Thus, the bump structures of the IC devices and the contact pads of the mother circuit board may be bonded to each other with high stability and reliability.

Then, the mold 300 may be formed on a whole surface of the mother circuit board to a sufficient thickness to cover the IC devices 200 (S300). For example, an epoxy mold compound (EMC) may be coated on the mother circuit board to a sufficient thickness to cover the IC devices 200 by a molding process, thereby continuously forming the mold 300 on a whole surface of the mother circuit board.

The mold 300 may be planarized until the surface of the IC device 200 is exposed (S400). For example, a chemical mechanical polishing (CMP) process may be performed on the mold 300, until the surface of the IC device 200 is exposed. The thickness of the mold 300 may be varied by controlling the conditions of the CMP regarding the requirements of the semiconductor package 1000.

The IC devices 200 may also be planarized together with the mold 300, and the thickness of the silicon substrate of the IC devices 200 may be reduced. The semiconductor package 1000 may be sufficiently reduced to a proper overall thickness by decreasing the thickness of the mold 300 and the IC device 200. In addition, the surfaces of the IC device 200 and the mold 300 may be coplanar with each other. The IC devices 200 may be mounted on the mother circuit board in a face-up or a face-down configuration. Thus, an active face or a rear face of the IC device 200 may be planarized according to the mounting type of the IC device 200. In case that the active face of the IC device 200 may be planarized, a passivation layer may be formed to a greater thickness in consideration of the chip planarization.

The surface profile modifier 400 may be formed on the surfaces of the IC device 200 and the mold 300, thereby enlarging the surface area for the heat dissipation and the adhesion (S500).

The surface profile modifier 400 may be formed on a whole surface of the mother circuit board including the surface of the IC device 200 and the surface of the mold 300. The surface profile modifier 400 may be formed into various shapes and configurations such that the surface area for the heat dissipation and the adhesion is sufficiently enlarged.

For example, the surface profile modifier 400 may be in the form of thermally conductive particles 401 that are randomly distributed on the whole surface of the mother circuit board, as illustrated in FIG. 2. According to the flow chart of FIG. 8, a liquid mixture including the thermally conductive particles 401 and a volatile solvent may be coated onto the surface of the mother circuit board S510), and a vaporization process may be performed in such a way that the volatile solvent of the mixture is removed from the coated mixture and the thermally conductive particles 401 remain on the mother circuit board (S520). The vaporization time of the coated mixture may be reduced as according to the volatility of the solvent. The thermally conductive particles 401 may include a material having good thermal conductivity, such as a metal, silicon, or diamond (C). The thermally conductive particles 401 may be coated on the surface of the mother circuit board by a surface wetting process in coating the mixture on the surface of the mother circuit board. The thermally conductive particles 401 may be randomly distributed on the surface of the mother circuit board. In the present example embodiment, the thermally conductive particles 401 may have a diameter of about 1 µm to about 100 µm, and the volatile solvent may have such characteristics that the thermally conductive particles 401 in the coated mixture have an contact angle as large as possible with respect to the surface of the mother circuit board. The thermally conductive particles remaining on the surface of the mother circuit board may have a surface area as large as possible.

The thermally conductive particles 401 may be formed into a pattern (hereinafter, referred to as a particle pattern) on the surface of the mother circuit board. For example, as illustrated in FIG. 9, a mask pattern may be formed on a whole surface of the mother circuit board (S530), and the thermally conductive particles may be injected onto the mask pattern (S540). Thus, the thermally conductive particles may be bonded to the surfaces of the IC devices, the mold and the mask pattern. The thermally conductive particles 401 may be bonded to surfaces of the IC device and the mold that are exposed through the mask pattern. Then, the mask pattern may be removed from the mother circuit board S550), and the particle pattern may be transcribed on the mother circuit board according the shape of the mask pattern. The thermally conductive particles may be injected onto the mask pattern by a spray process or a vacuum absorber process.

In other implementations, the surface profile modifier 400 may be formed as a heat transfer pattern 402 or as a plurality of recesses 403. For example, as illustrated in FIG. 10, a thermally conductive layer may be formed on the surface of the mother circuit board (S560), and the thermally conductive layer may be patterned into the heat transfer pattern 402 on the surface of the mother circuit board (S570). For example, a material having high thermal conductivity may be deposited onto the mother circuit board by a chemical vapor deposition (CVD) process, thereby forming the thermally conductive layer on the mother circuit board. The thermally conductive layer may include a thin layer including aluminum or copper. Then, a mask pattern may be formed on the thermally conductive layer and an etching process against the thermally conductive layer may be performed using the mask pattern as an etching mask, thereby forming the heat transfer pattern on the mother circuit board.

In other implementations, the heat transfer pattern may be formed on the mother circuit pattern by a plating process. For example, a mask pattern may be formed on the mother circuit pattern in such a way that the surfaces of the IC devices 200 and the mold 300 are regularly exposed, and a conductive layer may be formed only on the exposed surfaces of the IC devices 200 and the mold 300 by an electroless plating process, thereby forming the heat transfer pattern on the mother circuit board.

In place of the electroplating process, a surface process may be performed on the exposed surfaces of the IC devices 200 through the mask pattern and the mold 300, thereby forming recesses on the mother circuit board. For example, a plasma etching process may be performed on the mother circuit board using the mask pattern as an etching mask, and thus the recesses 403 may be formed on the surfaces of the IC devices 200 and the mold 300. As a modified example, a surface treatment such as a sand blasting process may be performed on the surfaces of the IC devices 200 and the mold 300 exposed through the mask pattern, thereby forming the recesses 300.

When the heat transfer pattern 402 includes the same materials as the mask pattern, subsidiary recesses 404 or subsidiary studs 405 may be formed on the mother circuit board together with the heat transfer pattern 402. The subsidiary recesses 404 and the subsidiary studs 405 may be formed on the surfaces of the IC devices 200 and the mold 300 exposed through the heat transfer pattern 402. The surface profile modifier 400 may include the heat transfer pattern 402 and the subsidiary recesses 404 or the subsidiary studs 405.

When the heat transfer pattern 402 includes silicon oxide, the heat transfer pattern 402 may function as a mask pattern for a dry etching process. The surfaces of the IC devices 200 and the mold 300 exposed through the heat transfer pattern 402 may be etched by the dry etching process. Thus the subsidiary recesses 404 or the subsidiary studs 405 may be formed on the mother circuit board together with the heat transfer pattern 402.

Thereafter, the mother circuit board on which the IC devices 200 may be mounted may be cut along the scribe lines according to units of the mounting area, thereby providing a plurality of preliminary packages in which the surface profile modifier is arranged on the IC devices 200 and the mold 300. The adhesive member 500 and the dissipating member 600 may be formed on the preliminary package, thereby manufacturing the semiconductor package 1000.

According to the example embodiments of the semiconductor package and the method of the same, a plurality of the IC devices 200 and the mold layer 300 may be formed on respective mounting areas of the mother circuit board in such a way that an upper surface of the IC devices may be coplanar with an upper surface of the mold 300. Then, the surface profile modifier 400 may be formed on the upper surfaces of the IC devices and the mold along the whole surface of the mother circuit board. Thereafter, the mother circuit board having the surface profile modifier may be cut into pieces along the scribe lines, thereby providing preliminary packages, each having the surface profile modifier. For example, the surface profile modifier may be formed across an entire mother circuit board, so that the process efficiency for forming the surface profile modifier may be increased. The adhesive member and the dissipating member may arranged on the package having the surface profiler modifier, thereby enlarging the surface area for dissipating heat and for contacting the adhesive member. In addition, the surface profile modifier may be formed on the surface of the mold 300 as well as on the surface of the IC device 200. Thus, the surface area for contacting with the semiconductor package with external bodies may be sufficiently enlarged. Warpage of a silicon substrate of the IC devices may be sufficiently prevented or reduced, even though a large amount of the heat may be generated from the IC devices when operating the semiconductor package. The surface profile modifier may improve the mechanical stability and reliability, as well as the dissipation capability, of the semiconductor package.

The surface profile modifier may include thermally conductive particles together with the recesses or studs, thereby greatly enlarging the surface area for dissipating heat and for contacting the adhesive member. The larger the surface area of the surface profile modifier, the greater the dissipation capability of the semiconductor package and the less the substrate warpage of the IC devices of the semiconductor package.

The present example embodiments of the memory device may be applied to various electronic systems including semiconductor devices and IC chips such as telecommunication systems and storage systems.

By way of summation and review, the higher performance of high density semiconductor packages at higher speeds necessarily generates a large quantity of heat in the semiconductor package. Thus, a sufficient thermal dissipation becomes an important issue for increase the operation stability and product reliability of the semiconductor package and the electronic systems including the package. For these reasons, various dissipation systems have been suggested for the high density semiconductor packages.

In conventional thermal dissipation systems, a major portion of heat is dissipated by thermal conduction in which a thermal dissipation member makes direct contact with a semiconductor package. A minor portion of the heat is dissipated by thermal convection such as a forced circulation of air. For example, a dissipating plate such as a heat sink may be arranged on the semiconductor package selectively in conjunction with an active circulator of air. Thus, most of the heat is dissipated out of the semiconductor package by the heat conduction through the heat sink and the heat is also secondarily dissipated by the heat convection through the active-circulated air.

Recent high density semiconductor packages typically generate heat exceeding a critical temperature of an adhesive interposed between the semiconductor package and the dissipating plate. Thus, the dissipating plate may become separated from the semiconductor package, and the overall thermal dissipation capability of the semiconductor package may deteriorate even when the thermal dissipation characteristics of the heat sink are sufficiently improved.

Poor heat dissipation from a semiconductor package typically causes various failures in the semiconductor package such as operation failures of IC (integrated circuit) chips and warpage due to the difference of thermal expansion coefficients between the dissipation plate and the die, which eventually causes a breakdown of the semiconductor package and the electronic systems including the semiconductor package.

Accordingly, a high density semiconductor package having good thermal dissipation characteristics and warpage-resistive characteristics is desirable.

Embodiments provide a high density semiconductor package having improved surface profile and roughness and a method of manufacturing the same.

Embodiments provide a semiconductor package having a surface profile modifier by which the surface profile of a mold and a rear portion of a die can be easily enlarged. The surface profile modifier may be formed on upper surfaces of an IC devices and a mold along the whole surface of a mother circuit board in various shapes and structures. The surface profile modifier may include thermally conductive particles selectively together with recesses or studs, thereby enlarging the surface area for the dissipating heat and for contacting with the adhesive member. Therefore, the warpage of the silicon substrate of the IC devices may be sufficiently prevented even though a large amount of the heat may be generated from the IC devices when operating the semiconductor package. The surface profile modifier may improve the mechanical stability and reliability as well as the dissipation capability of the semiconductor package.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of manufacturing a semiconductor package, the method comprising:
   providing a mother circuit board having a plurality of mounting areas, each mounting area including an inner circuit pattern and a plurality of contact pads that are connected to the inner circuit pattern;
   mounting integrated circuit (IC) devices on the mother circuit board in such a manner that respective ones of the IC devices make contact with respective ones of the contact pads at each mounting area of the mother circuit board;
   forming a mold on a whole surface of the mother circuit board to cover the IC devices;
   exposing a surface of the IC devices by planarizing the IC devices and the mold;
   forming a surface profile modifier on the exposed surfaces of the IC devices and on an upper surface of the mold; and cutting the mother circuit board to separate the mounting areas into units, wherein forming the surface profile modifier includes:

forming a thermally conductive layer on a whole surface of the mother circuit board;

forming a heat transfer pattern on the mother circuit board by patterning the thermally conductive layer, such that portions of the surface of the IC devices and the surface of the mold are not covered by the heat transfer pattern; and forming a plurality of recesses in the portions of the surface of the IC devices and the surface of the mold that are not covered by the heat transfer pattern, by a surface process using the heat transfer pattern as a process mask.

2. The method as claimed in claim 1, wherein the surface process includes one of a dry etching process and a sand blasting process.

3. A method of manufacturing a semiconductor package, the method comprising:

providing a mother circuit board having a plurality of mounting areas, each mounting area including an inner circuit pattern and a plurality of contact pads that are connected to the inner circuit pattern;

mounting integrated circuit (IC) devices on the mother circuit board in such a manner that respective ones of the IC devices make contact with respective ones of the contact pads at each mounting area of the mother circuit board;

forming a mold on a whole surface of the mother circuit board to cover the IC devices;

exposing a surface of the IC devices by planarizing the IC devices and the mold;

forming a surface profile modifier on the exposed surfaces of the IC devices and on an upper surface of the mold;

forming an adhesive member on the surface of the IC device and the surface of the mold and the surface profile modifier, the surface profile modifier enlarging a contact area with the adhesive member; and forming a heat dissipating member on the adhesive member; and cutting the mother circuit board to separate the mounting areas into units.

* * * * *